(12) United States Patent
Chien

(10) Patent No.: US 8,020,511 B2
(45) Date of Patent: Sep. 20, 2011

(54) FILM COATING HOLDER

(75) Inventor: Shih-Che Chien, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 407 days.

(21) Appl. No.: 12/330,568

(22) Filed: Dec. 9, 2008

(65) Prior Publication Data

US 2009/0277381 A1 Nov. 12, 2009

(30) Foreign Application Priority Data

May 6, 2008 (CN) .......................... 2008 1 0301446

(51) Int. Cl.
*B05C 13/00* (2006.01)
*B05C 11/11* (2006.01)
*C23C 16/00* (2006.01)

(52) U.S. Cl. ........ 118/500; 118/503; 118/504; 118/730; 118/731

(58) Field of Classification Search .................. None
See application file for complete search history.

(56) References Cited

U.S. PATENT DOCUMENTS

| | | | | |
|---|---|---|---|---|
| 4,817,559 | A | * | 4/1989 | Ciparisso ...................... 118/731 |
| 4,841,585 | A | * | 6/1989 | Masuzawa ........................ 5/610 |
| 5,026,469 | A | * | 6/1991 | Kunkel et al. ............. 204/298.15 |
| 6,171,462 | B1 | * | 1/2001 | Gries et al. ............... 204/298.15 |

* cited by examiner

*Primary Examiner* — Dah-Wei Yuan
*Assistant Examiner* — Binu Thomas
(74) *Attorney, Agent, or Firm* — Altis Law Group, Inc.

(57) ABSTRACT

An exemplary film coating holder includes a main body, a plurality of workpiece holders, and a driving module. The main body includes a plurality of through holes defined therein and a central axis. The main body is capable of rotating around the central axis. Each workpiece holder is arranged in each through hole and pivotally connected with the main body by an axle. A rotating guide groove is defined around each axle. The driving module includes a control unit and a shaft. The control unit inserts the shaft in the rotating guide groove of the workpiece holder. When the main body is rotating around the central axis, the shaft can drive the workpiece holder to turn over by the guiding of the rotating guide groove.

9 Claims, 5 Drawing Sheets

FILM COATING HOLDER

BACKGROUND

1. Technical Field

The present invention relates to a film coating device, and particularly relates to a film coating holder.

2. Discussion of Related Art

Generally, in a film coating process for workpieces (e.g., lenses), the workpieces are placed on a film coating holder. After a surface of each workpiece is coated, the workpieces are manually turned over on the film coating holder so that the opposite surface of the workpieces can be coated. However, this process is time-consuming.

Therefore, a new film coating holder is desired to overcome the shortcomings described above.

BRIEF DESCRIPTION OF THE DRAWINGS

Many aspects of the present film coating holder can be better understood with reference to the following drawings. The components in the drawings are not necessarily to scale, the emphasis instead being placed upon clearly illustrating the principles of the present film coating holder. Moreover, in the drawings, like reference numerals designate corresponding parts throughout the several views.

DETAILED DESCRIPTION OF EMBODIMENTS

Reference will now be made to the drawings to describe in detail of the exemplary embodiment of the film coating holder.

Figure 1:
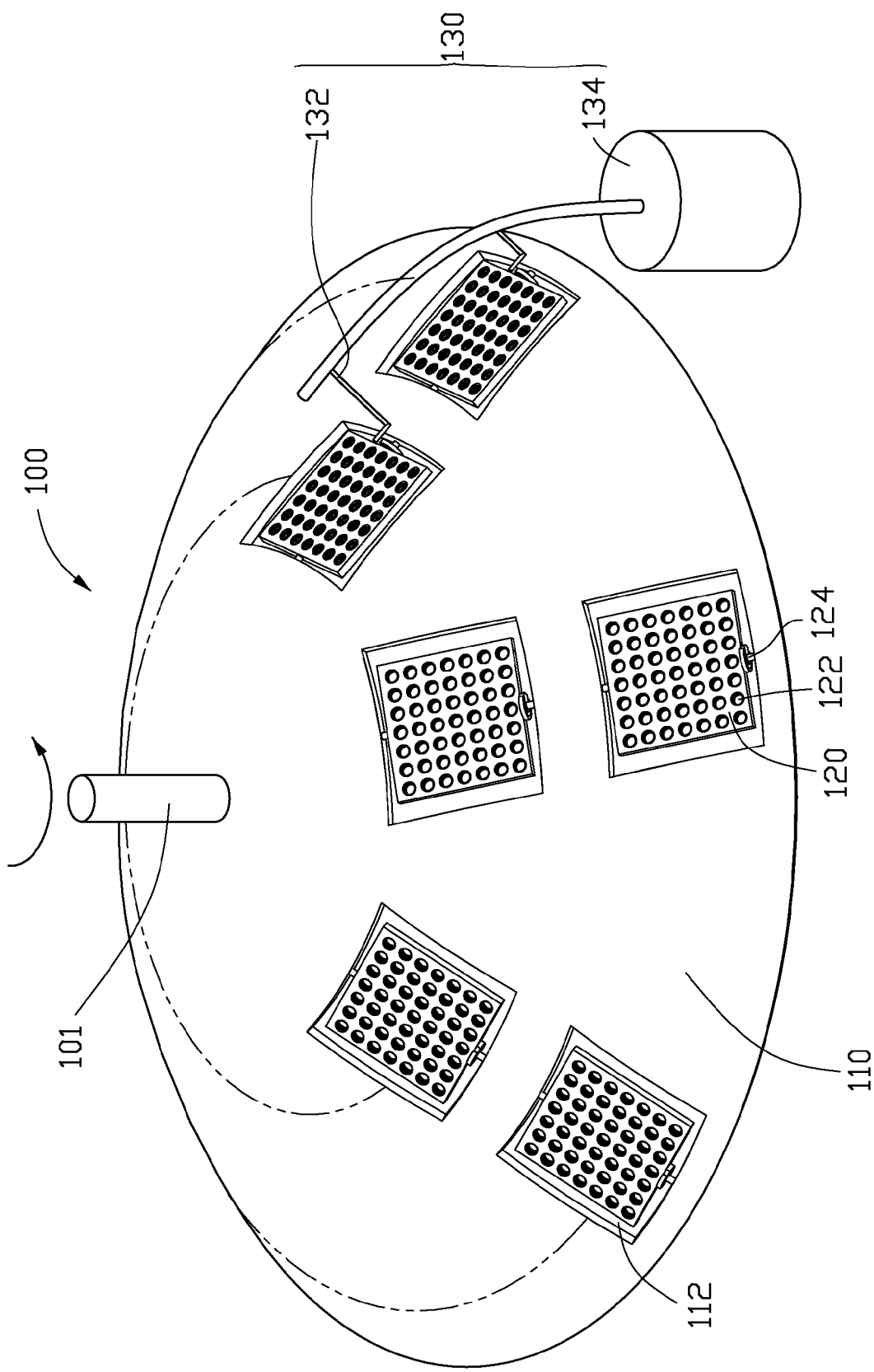
FIG. 1 is a schematic view of a film coating holder in accordance with an exemplary embodiment.

Referring to FIG. 1, a film coating holder 100, in accordance with an exemplary embodiment, includes a main body 110, a plurality of workpiece holders 120 arranged in the main body 110, and a driving module 130 configured for driving the workpiece holders 130 to turn over.

The main body 110 is made of a highly thermal conductive metallic material, such as copper, aluminum, or stainless steel. In the present embodiment, the main body 110 is umbrella-shaped and includes a central axis 101. The main body 110 is capable of rotating around the central axis. A plurality of through holes 112 is defined in the main body 110 for receiving the workpieces holders 120. The shape of the through holes 112 may be rectangular, fan-shaped, circular, etc. In the present embodiment, the shape is rectangular. The through holes 112 are arranged symmetrically, from the central axis 101, on the main body 110. The through holes 112 are also aligned in rows in the same horizontal plane.

The workpiece holders 120 are made of a highly thermally conductive metallic material, such as copper, aluminum, or stainless steel, or it can be made from plastic, such as Polycarbonate (PC), Acrylonitrile Butadiene Styrene (ABS), etc. The shape of the workpiece holders 120 may be rectangular, fan-shaped, circular, etc. The workpiece holders 120 should be received and rotate freely in the through holes 112 of the main body 110. In the present embodiment, the workpiece holders 120 are rectangular. Each workpiece holder 120 has the same size and is arranged symmetrically on the main body 110.

Each workpiece holder 120 includes at least one through hole 122, configured for receiving the workpiece (not shown) to be coated. The workpiece (not shown) may be a glass lens or a plastic lens.

Figure 2:
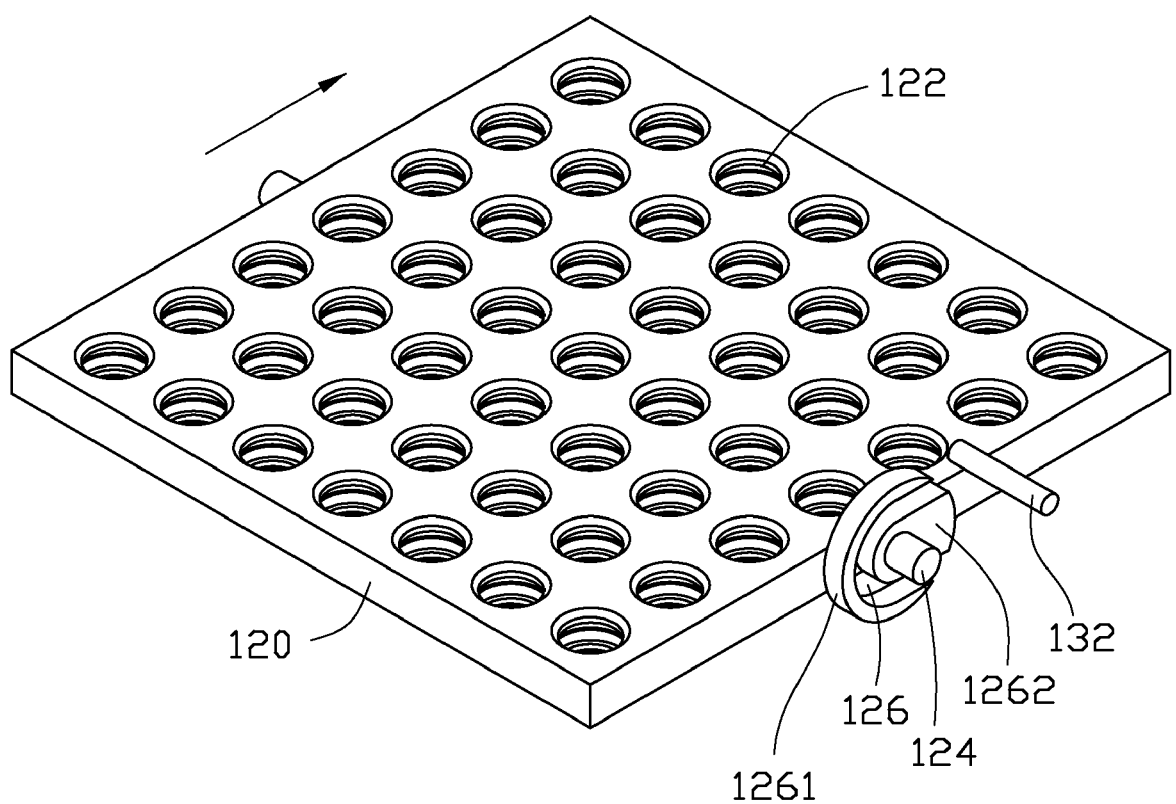
FIGS. 2 to 5 are schematic, state diagrams of the film coating holder of FIG. 1 at different states.

Referring to FIG. 2, each workpiece holder 120 rotates about an axis that passes through the center of the axle 124 that is securely mounted to the workpiece holder 120. Each through hole 112 has two grooves (not shown) defined therein for receiving the axle 124. The axle 124 is configured to pivotally mount in the through hole 112. A rotating guide groove 126 is defined around each axle 124 and is arranged on the outer side of one end of each workpiece holder 120.

The rotating guide groove 126 is semilunar and is formed by a first block 1261 and a second block 1262. The first block 1261 is semilunar. One end of the second block 1262 is rectangular and the opposite end is circular-arc. The second block 1262 is arranged in the semilunar inner side of the first block 1261, and the circular-arc end of the second block 1262 is opposite to the inner side of the first block 1261, to cooperate with the first block 1261 to form the rotating guide groove 126. The shape of the rotating guide groove 126 could also be circular-arc, U-shaped, horseshoe shape, etc.

Referring back to FIG. 1, the driving module 130 includes at least one shaft 132 and a control unit 134. In the present embodiment, the main body 110 includes two rows of workpiece holders 120. Correspondingly, the driving module 130 includes two shafts 132, and each shaft 132 is correspondingly arranged opposite to a line of the workpiece holders 120. The shaft 132 is configured for turning over a plurality of workpiece holders 120 on the same horizontal plane.

The shaft 132 is controlled by the control unit 134 to be inserted into the rotating guide groove 126 of the workpiece holder 120. When the main body 110 is rotating around the central axis 101, and the shaft 132 is engaged in the rotating guide groove 126 of the corresponding workpiece holder 120, the shaft 132 can drive the workpiece holder 120 to turn over by the resisting of the shaft 132 against the rotating guide groove 126. The control unit 134 may be an electric motor, an electromagnetic pump or a magnetic current motor, etc.

During functioning of the film coating holder 110, the main body 110 is rotating at all time in a counterclockwise direction, thus the workpiece holders 120 move with respect to the main body 110 substantially from left to right. As such, the shafts 132 when engaged in the rotating guide grooves 126 can drive the workpiece holders 120 to turn over.

Referring to FIGS. 2 to 5, the different states of a workpiece holder 120 of the film coating holder 100 are shown when the workpiece holder 120 is turned over. Each workpiece holder 120 and shaft 132 are respectively in different positions.

Figure 3:
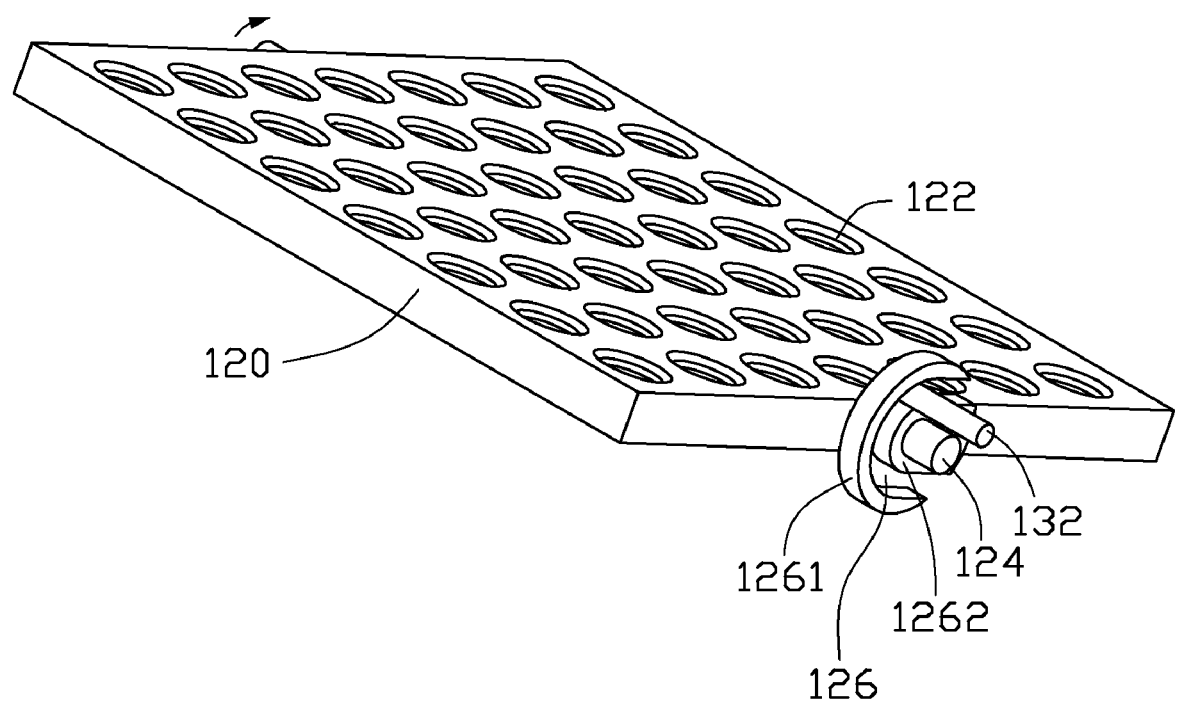
Figure 4:
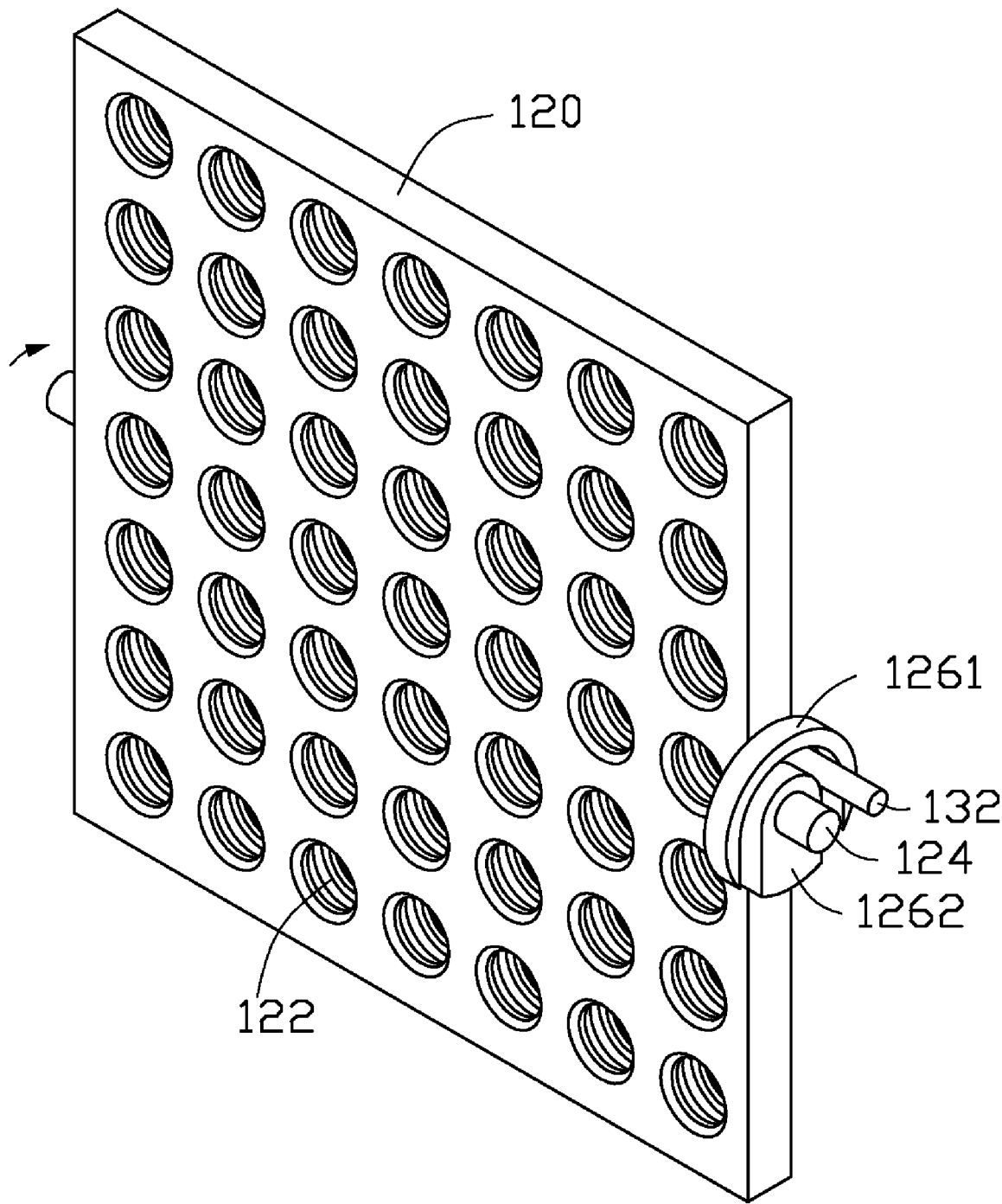
Figure 5:
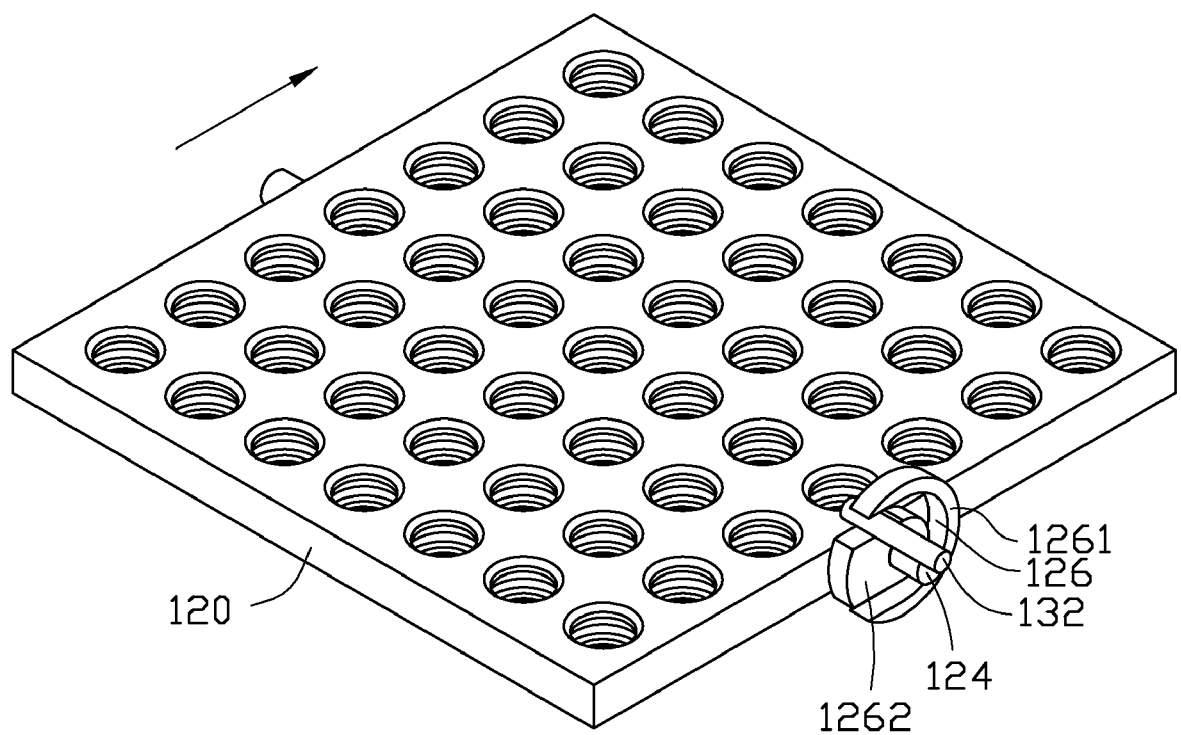

Referring to FIG. 2, the workpiece holder 120 before it is turned over is shown. By rotating of the main body 110 counterclockwise, the workpiece holder 120 will correspondingly move from left to the right. Accordingly, the shaft 132 will correspondingly engaged into the rotating guide groove 126, as shown in FIG. 3.

The first block 1261 of the rotating guide groove 126 is semilunar and the inner side of the first block 1261 is circular-arc. When the shaft 132 is inserted in the guide groove 126, the resisting force of the shaft 132 against the first block 1261 will cause the workpiece holder 120 to rotate clockwise because of the counterclockwise movement of the main body 110, see FIG. 4.

When the workpiece holder 120 is rotated 90 degrees, the shaft 132 is now positioned in the most inner side of the rotating guide groove 126. As the main body 110 continues to move counterclockwise, the shaft 132 will traverse the same path as before but in the position direction, causing the workpiece holder 120 to continue to rotate in the clockwise direction, see FIG. 5.

When the workpiece holder 120 is turned over 180 degree, the shaft 132 disengages from the rotating guide groove 126.

As a result, the workpiece holder 120 is turned over automatically. The next workpiece holder 120 on the same horizontal plane on the main body 110 will move to the position close to the shaft 132 and engaged with the corresponding rotating guide groove 126 to make the next workpiece holder 120 turn over.

When all of the workpiece holders 120 are turned over, the main body 110 is stopped and the shaft 132 can be lifted by control of the control unit 134, so to separate the shaft 312 from the workpiece holders 120. Then, the filming coating device can be restarted, and the opposite surface of the workpieces can be coated by the film coating device.

Comparing with the related art, the workpiece holders 120 can be turned over automatically. Therefore, the filming coating device can save much time of the film coating process and the efficiency of the coating will be improved.

While the present invention has been described as having preferred or exemplary embodiments, the embodiments can be further modified within the spirit and scope of this disclosure. This application is therefore intended to cover any variations, uses, or adaptations of the embodiments using the general principles of the invention as claimed. Further, this application is intended to cover such departures from the present disclosure as come within known or customary practice in the art to which the invention pertains and which fall within the limits of the appended claims or equivalents thereof.

What is claimed is:

1. A film coating holder, comprising:
   a main body comprising a plurality of through holes defined therein and a central axis, the main body being capable of rotating around the central axis;
   a plurality of workpiece holders, each workpiece holder arranged in each through hole, each workpiece holder being pivotally connected with the main body by an axle, a rotating guide groove defined around each axle, wherein the rotating guide groove is defined by a first block and a second block, the shape of the rotating guide groove is circular-arc, and the rotating guide groove comprises two open ends; and
   a driving module comprising a control unit and a shaft, the control unit configured to control the shaft to insert into the rotating guide grooves of the workpiece holders, when the main body rotates about the central axis, the shaft is inserted in the rotating guide groove of a corresponding workpiece holder from one of the open ends, slides along the rotating guide groove and resists against an inner surface of the rotating guide groove to turn the corresponding workpiece holder over, and then leaves the rotating guide groove from the other open end.

2. The film coating holder of claim 1, wherein the rotating guide groove is arranged in the outer side of one end of the axle of the workpiece holder.

3. The film coating holder of claim 1, wherein the shape of the first block is circular-arc, one end of the second block is rectangular and the opposite end is circular-arc, the second block is arranged in the semilunar inner side of the first block, and the circular-arc end of the second block is opposite to the inner side of the first block to cooperate with the first block to form the rotating guide groove.

4. The film coating holder of claim 1, wherein the main body is umbrella-shaped, the plurality of through holes is arranged symmetrically, from the main axis, on the main body, many through holes are aligned in the same horizontal plane.

5. The film coating holder of claim 1, wherein each workpiece holder has the same size, and is arranged symmetrically on the main body.

6. The film coating holder of claim 1, wherein the control unit is an electric motor, an electromagnetic pump or a magnetic current motor.

7. The film coating holder of claim 1, wherein each workpiece holder comprises at least one through hole configured for receiving the workpiece to be coated.

8. The film coating holder of claim 1, wherein the workpiece holder is made of highly thermal conductive metal or plastic.

9. The film coating holder of claim 1, wherein the main body is made of a highly thermal conductive metallic material.

* * * * *